United States Patent
Lin et al.

(10) Patent No.: US 6,569,771 B2
(45) Date of Patent: May 27, 2003

(54) CARRIER HEAD FOR CHEMICAL MECHANICAL POLISHING

(75) Inventors: Juen-Kuen Lin, Kaohsiung (TW); Tzu-Shin Chen, Taipei (TW); Chien-Hsin Lai, Kaohsiung (TW); Yung-Tsung Wei, Pai-Ho Chen (TW)

(73) Assignee: United Microelectronics Corp., Taiwan (CN)

( * ) Notice: Subject to any disclaimer, the term of this patent is extended or adjusted under 35 U.S.C. 154(b) by 0 days.

(21) Appl. No.: 10/119,676

(22) Filed: Apr. 11, 2002

(65) Prior Publication Data

US 2003/0079836 A1 May 1, 2003

Related U.S. Application Data

(60) Provisional application No. 60/336,382, filed on Oct. 31, 2001.

(51) Int. Cl.[7] .................... H01L 21/302; H01L 21/461
(52) U.S. Cl. ................ 438/692; 451/288; 156/345.12
(58) Field of Search ........................... 438/633, 691, 438/692, 693; 156/345.12; 451/28, 287, 288, 397, 398, 41

(56) References Cited

U.S. PATENT DOCUMENTS

| 6,132,298 | A | * | 10/2000 | Zuniga et al. | ............... | 451/288 |
| 6,194,317 | B1 | * | 2/2001 | Kaisaki et al. | ............... | 438/692 |
| 6,244,942 | B1 | * | 6/2001 | Zuniga | ............... | 451/288 |
| 6,251,215 | B1 | * | 6/2001 | Zuniga et al. | ......... | 156/345.12 |
| 6,358,121 | B1 | * | 3/2002 | Zuniga | ............... | 451/41 |
| 6,494,774 | B1 | * | 12/2002 | Zuniga et al. | ............... | 451/398 |

* cited by examiner

Primary Examiner—Carl Whitehead, Jr.
Assistant Examiner—William Vesperman

(57) ABSTRACT

A new designed carrier head for chemical mechanical polishing is disclosed. The carrier head has a non-rigid incision ring having a downwardly-projecting non-rigid incision and surrounding a support plate of the carrier head instead of conventional incision or rip disposed in a conventional support plate. The carrier head also has a flexible membrane extending around the edges of the support plate, wherein the edge of the flexible membrane is at predetermined distance from the incision.

13 Claims, 1 Drawing Sheet

CARRIER HEAD FOR CHEMICAL MECHANICAL POLISHING

This application claims the benefit of Provisional Application No. 60/336,382, filed Oct. 31, 2001.

BACKGROUND OF THE INVENTION

1. Field of the Invention

The present invention relates to a carrier head for chemical mechanical polishing, and more particularly to a carrier head for chemical mechanical polishing that can improve polishing uniformity.

2. Description of the Related Art

Integrated circuits are typically formed on substrates, particularly silicon wafers, by the sequential deposition of conductive, semiconductive or insulative layers. After each layer is deposited, the layer is etched to create circuitry features. As a series of layers are sequentially deposited and etched, the outer or uppermost surface of the substrate, i.e., the exposed surface of the substrate, becomes increasingly non-planar. This non-planar outer surface presents a problem for the integrated circuit manufacturer. Therefore, there is a need to periodically planarize the deposited layer surface to provide a flat surface.

Chemical mechanical polishing (CMP) is one accepted method of planarization. This method typically requires that the substrate be mounted on a carrier or polishing head. The exposed surface of the substrate is then placed against a rotating polishing pad. The carrier head provides a controllable load, i.e., pressure, on the substrate to push it against the polishing pad. In addition, the carrier head may rotate to provide additional motion between the substrate and polishing surface.

A polishing slurry, including an abrasive and at least one chemically-reactive agent, may be supplied to the polishing pad to provide an abrasive chemical solution at the interface between the pad and the substrate. CMP is a fairly complex process, and it differs from simple wet sanding. In a CMP process, the reactive agent in the slurry reacts with the outer surface of the substrate to form reactive sites. The interaction of the polishing pad and abrasive particles with the reactive sites on the substrate results in polishing of the substrate.

An effective CMP process not only provides a high polishing rate, but also provides a substrate surface which is finished (lacks small-scale roughness) and flat (lacks large-scale topography). The polishing rate, finish and flatness are determined by the pad and slurry combination, the relative speed between the substrate and pad, and the force pressing the substrate against the pad. The polishing rate sets the time needed to polish a layer. Because inadequate flatness and finish can create defective substrates, the selection of a polishing pad and slurry combination is usually dictated by the required finish and flatness. Given these constraints, the polishing time needed to achieve the required finish and flatness sets the maximum throughput of the CMP apparatus.

A recurring problem in CMP is non-uniformity of the polishing rate across the surface of the substrate. One source of this non-uniformity is the so-called "edge-effect", i.e., the tendency for the substrate edge to be polished at a different rate than the center of the substrate. Another source of non-uniformity is termed the "center slow effect", which is the tendency of center of the substrate to be underpolished. Yet another source of non-uniformity is termed as the fast band effect. The fast band effect causes an annular region of the substrate, the center of which is located approximately 15 millimeters to 20 millimeters from the substrate edge, to be significantly over-polished. This annular region may be about 20 millimeters wide. These non-uniform polishing effects reduce the overall flatness of the substrate and the substrate area suitable for integrated circuit fabrication, thus decreasing the process yield.

FIG. 1 shows a conventional carrier head for CMP. Carrier head 100 comprising a main frame 102, a retaining ring 104, an edge load ring 106, a support plate 108 having a incision or lip 110, and a flexible membrane 112 are shown. Generally, carrier head 100 holds a substrate such as a wafer in position against a polishing pad and distributes a force across the back surface of the substrate. Support plate 108 as well as incision 110 are composed of a rigid material, such as a stainless steel. During polishing, a bladder (not shown) is used to cause incision 110 of support plate 108 to press the edge of flexible membrane 112 against the wafer being polished, thereby creating a tight contact between the wafer and flexible membrane 112. However, the rigidity of incision 110 and the winding phenomena of flexible membrane 112 during polishing would present non-uniformity of polishing such as the fast band effect and reduce the overall flatness of the wafer and the wafer area suitable for integrated circuit fabrication, thus decreasing the process yield.

Accordingly, it would be necessary to provide a CMP apparatus which ameliorates some, if not all, of these problems. The advantages of this invention are that it solves the problems mentioned above.

SUMMARY OF THE INVENTION

It is therefore an object of the invention to provide a modified carrier head which can effectively improve polishing uniformity.

It is another object of this invention to provide a carrier head which can overcome the fast band effect.

It is a further object of this invention to provide a carrier head which can provide a overall flatness of the substrate being polished and an improved process yield.

In one embodiment of this invention, the invention provides a carrier head for chemical mechanical polishing, said carrier head comprising: a main frame; a support plate disposed in said main frame having a non-rigid incision ring surrounding said support plate, said incision ring having a downwardly-projecting non-rigid incision; and a flexible membrane disposed under said support plate extending around the edges of said support plate, wherein said flexible membrane applies a load from said main frame on a substrate being polished against a polish pad.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

It is to be understood and appreciated that the structures described below do not cover a complete structure. The present invention can be practiced in conjunction with various conventional CMP apparatus fabrication techniques that are used in the art, and only so much of the commonly practiced structures are included herein as are necessary to provide an understanding of the present invention.

The present invention will be described in detail with reference to the accompanying drawings. It should be noted that the drawings are in greatly simplified form and they are not drawn to scale. Moreover, dimensions have been exaggerated in order to provide a clear illustration and understanding of the present invention.

Figure 1:
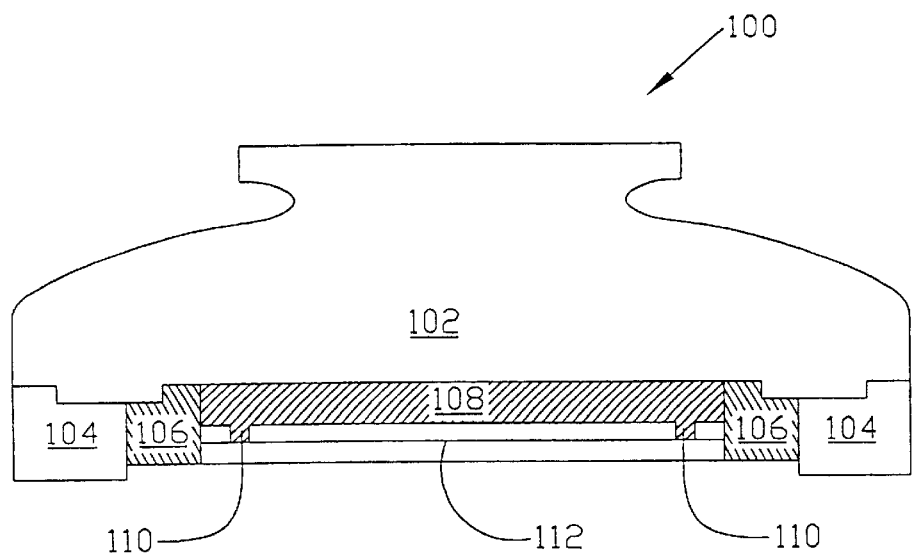
FIG. 1 shows a conventional carrier head for CMP.
Figure 2:
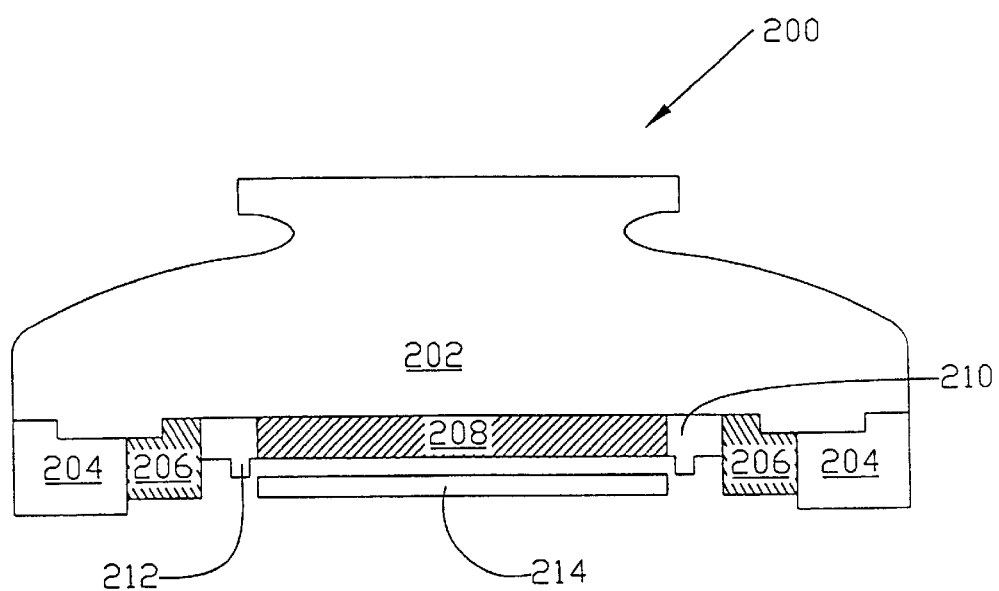
FIG. 2 shows a carrier head for CMP of this invention.

Referring to FIG. 2, carrier head 200 comprising a main frame 202, a retaining ring 204, an edge load ring 206, a support plate 208, a incision ring 210 having a incision 212, and a flexible membrane 214 are shown. During actual polishing, carrier head 200 lowers a substrate such as a wafer having deposited layers thereon into contact with a polishing pad. Generally, carrier head 200 holds the substrate in position against the polishing pad and distributes a force across the back surface of the substrate. The carrier head 200 also transfers torque from the drive shaft to the substrate. Main frame 202 may be generally circular in shape to correspond to the circular configuration of the substrate to be polished. A cylindrical bushing (not shown) may fit into a vertical bore (not shown ) through the main frame 202, and two or more passages may extend through the main frame 202 for pneumatic control of the carrier head 200.

Main frame 202 can be connected to a drive shaft (not shown) to rotate therewith during polishing about an axis of rotation (not shown) which is substantially perpendicular to the surface of the polishing pad during polishing. A loading chamber (not shown) of main frame 202 located above support plate 208 applies a load, i.e., a downward pressure, to support plate 208. The vertical position of support plate 208 relative to the polishing pad is also controlled by the loading chamber.

Retaining ring 204 may be a generally annular ring secured at the outer edge of main frame 202, e.g., by bolts (not shown). When fluid is pumped into the loading chamber, retaining ring 204 is pushed downwardly to apply a load to polishing pad. A bottom surface of retaining ring 204 may be substantially flat, or it may have a plurality of channels to facilitate transport of slurry from outside the retaining ring to the substrate. An inner surface of retaining ring 204 engages the wafer to prevent it from escaping from beneath the carrier head.

Edge-load ring 206 is a generally annular body located between retaining ring 204. Edge-load ring 206 includes a base portion having a substantially flat lower surface for applying pressure to a perimeter portion of the wafer being polished. Edge-load ring 206 is composed of a material, such as a stainless steel, ceramic, anodized aluminum, that is relatively rigid compared to the flexible membrane 214. A layer of compressible material (not shown), such as a carrier film, may be adhesively attached to lower surface of edge-load ring 206 to provide a mounting surface for the wafer being polished.

Support plate 208 may be a generally disk-shaped rigid member having a plurality of apertures formed therethrough. Incision ring 210 having incision or downwardly-projecting lip 212 at its outer edge is mounted at the outer edge of support plate 208. Incision ring 210 preferably comprises a non-rigid ring such as a colloid ring. Incision or downwardly-projecting lip 212 also preferably comprises a non-rigid incision or lip composed of the same material of incision ring 210.

Flexible membrane 214 is a generally circular sheet formed of a flexible and elastic material, such as neoprene, chloroprene, ethylene propylene or silicone rubber. Flexible membrane 214 extends around the edges of support plate 208. The edge of flexible membrane 214 is at a predetermined distance from incision 212, and it is preferably about 1 centimeter. During polishing, a bladder (not shown) of main frame 202 is used to cause support plate 208 to press flexible membrane 214 against the wafer being polished, thereby creating a tight contact between the wafer and flexible membrane 214. Because incision 212 is non-rigid and the edge of flexible membrane 214 is at a predetermined distance from incision 212, the annular region on the edge of the substrate being polished will not be over-polished and flexible membrane 214 will not wind, so that the non-uniformity phenomena such as the fast band effect can be avoided and the process yield can be improved.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A carrier head for chemical mechanical polishing, said carrier head comprising:
    a main frame;
    a rigid support plate disposed in said main frame having a non-rigid incision ring surrounding said support plate, said incision ring having a downwardly-projecting non-rigid incision; and
    a flexible membrane disposed under and in contact with said rigid support plate extending to the edges of said rigid support plate and within the downward-projecting non-rigid incisions, wherein said flexible membrane provides a load from said main frame on a substrate being polished against a polish pad.

2. The carrier head according to claim 1, wherein said non-rigid incision ring comprises a colloid incision ring.

3. The carrier head according to claim 1, wherein the edge of said flexible membrane is at a distance about 1 centimeter from said incision.

4. The carrier head according to claim 1, wherein said support plate is composed of stainless steel.

5. The carrier head according to claim 1, wherein said substrate comprises a silicon wafer having deposited layers thereon.

6. A carrier head for chemical mechanical polishing, said carrier head comprising:
    a main frame;
    a rigid support plate disposed in said main frame having a non-rigid incision ring surrounding said support plate, said incision ring having a downwardly-projecting non-rigid incision; and
    a flexible membrane disposed under and in contact with said rigid support plate extending to the edges of said rigid support plate and within the downward-projecting non-rigid incisions, wherein the edge of said flexible membrane is at a predetermined distance from said incision, and said flexible membrane applies a load from said main frame on a substrate being polished against a polish pad.

7. The carrier head according to claim 6, wherein said non-rigid incision ring comprises a colloid incision ring.

8. The carrier head according to claim 6, wherein said support plate is composed of stainless steel.

9. The carrier head according to claim 6, wherein said predetermined distance is about 1 centimeter.

10. The carrier head according to claim 6, wherein said substrate comprises a silicon wafer having deposited layers thereon.

11. A carrier head for chemical mechanical polishing, said carrier head comprising:
- a main frame;
- a rigid support plate disposed in said main frame having a colloid incision ring surrounding said support plate, said colloid incision ring having a downwardly-projecting colloid incision; and
- a flexible membrane disposed under and in contact with said rigid support plate extending to the edges of said rigid support plate and within the downward-projecting non-rigid incisions, wherein the edge of said flexible membrane is at distance about 1 centimeter from said colloid incision, and said flexible membrane applies a load from said main frame on a substrate being polished against a polish pad.

12. The carrier head according to claim 11, wherein said support plate is composed of stainless steel.

13. The carrier head according to claim 11, wherein said substrate comprises a silicon wafer having deposited layers thereon.

* * * * *